(12) United States Patent
Sung et al.

(10) Patent No.: US 10,568,240 B2
(45) Date of Patent: Feb. 18, 2020

(54) COOLANT FLOW DISTRIBUTION USING COATING MATERIALS

(71) Applicant: Ford Global Technologies, LLC, Dearborn, MI (US)

(72) Inventors: Myung Ki Sung, Ypsilanti, MI (US); Edward Chan-Jiun Jih, Troy, MI (US); Michael W. Degner, Novi, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 734 days.

(21) Appl. No.: 15/198,925

(22) Filed: Jun. 30, 2016

(65) Prior Publication Data

US 2018/0007814 A1 Jan. 4, 2018

(51) Int. Cl.
*H05K 7/20* (2006.01)
*F28D 15/00* (2006.01)
(Continued)

(52) U.S. Cl.
CPC ......... *H05K 7/20927* (2013.01); *F28D 15/00* (2013.01); *F28F 9/22* (2013.01); *F28F 13/06* (2013.01); *F28F 13/08* (2013.01); *F28F 13/18* (2013.01); *H02M 7/44* (2013.01); *H05K 7/20254* (2013.01); *F28D 2021/0028* (2013.01);
(Continued)

(58) Field of Classification Search
CPC . H05K 7/20927; H05K 7/20254; F28F 13/06; F28F 9/22; F28F 13/18; F28F 13/08; F28F 2245/04; F28F 2245/02; F28F 2250/102; F28F 2245/00; F28D 15/00; F28D 2021/0028; H01L 23/473
See application file for complete search history.

(56) References Cited

U.S. PATENT DOCUMENTS 3,613,779 A * 10/1971 Brown ...................... F28D 5/00
159/13.1
3,631,923 A * 1/1972 Izeki ......................... F28B 1/02
165/167

(Continued)

OTHER PUBLICATIONS

Ultratech International Inc., "Ultra-Ever Dry", Website, 16 pgs.

*Primary Examiner* — Jianying C Atkisson
*Assistant Examiner* — Jose O Class-Quinones
(74) *Attorney, Agent, or Firm* — David Kelley; Brooks Kushman P.C.

(57) ABSTRACT

Electronic devices are disclosed including hydrophobic or oleophobic coatings that control coolant flow therein or thereon. In at least one embodiment, a power inverter cold plate is provided including coolant inlet, a coolant outlet, a coolant flow spreading region, a coolant flow collection region, and a coolant heat-transfer region disposed therebetween; and one or more layers of a hydrophobic or oleophobic coating configured to control a flow of coolant in the cold plate. A method may include applying one or more layers of a hydrophobic or oleophobic coating to a power inverter cold plate to control a flow of coolant in the cold plate, the one or more layers being applied to one or more of a coolant flow spreading region, a coolant flow collection region, or a coolant heat-transfer region disposed therebetween. The layers may define coolant flow paths, eliminate recirculation zones, and/or prevent coolant leak paths.

12 Claims, 10 Drawing Sheets

(51) Int. Cl.
  *F28F 9/22* (2006.01)
  *F28F 13/06* (2006.01)
  *F28F 13/08* (2006.01)
  *F28F 13/18* (2006.01)
  *H02M 7/44* (2006.01)
  *H01L 23/473* (2006.01)
  *H01M 10/44* (2006.01)
  *H01M 10/48* (2006.01)
  *F28D 21/00* (2006.01)

(52) U.S. Cl.
  CPC ....... *F28F 2245/00* (2013.01); *F28F 2245/02* (2013.01); *F28F 2245/04* (2013.01); *H01L 23/473* (2013.01); *H01M 10/44* (2013.01); *H01M 10/486* (2013.01); *H01M 2220/20* (2013.01)

(56) References Cited

U.S. PATENT DOCUMENTS

| | | | |
|---|---|---|---|
| 5,184,478 A * | 2/1993 | Kutsuna | F25B 39/02 165/133 |
| 5,470,431 A * | 11/1995 | Okuda | F25B 39/022 159/27.1 |
| 5,724,479 A * | 3/1998 | Takahashi | E04D 13/103 392/496 |
| 7,204,298 B2 | 4/2007 | Hodes et al. | |
| 7,951,510 B2 * | 5/2011 | Ji | H01M 8/0221 429/522 |
| 8,842,435 B2 | 9/2014 | Joshi et al. | |
| 2005/0121782 A1 * | 6/2005 | Nakamura | B01L 3/5085 257/730 |
| 2006/0032611 A1 * | 2/2006 | Fujisaki | H01L 23/473 165/80.4 |
| 2006/0157227 A1 * | 7/2006 | Choi | B82Y 30/00 165/104.21 |
| 2006/0264073 A1 * | 11/2006 | Yang | H01L 23/473 439/72 |
| 2010/0214732 A1 * | 8/2010 | Charles | H05K 5/061 361/679.33 |
| 2010/0321889 A1 * | 12/2010 | Yoshino | H05K 7/20927 361/702 |
| 2011/0188204 A1 * | 8/2011 | Horiuchi | H01L 23/473 361/702 |
| 2011/0226445 A1 * | 9/2011 | Brand | F28F 3/12 165/70 |
| 2011/0303541 A1 * | 12/2011 | Garimella | B01D 57/02 204/450 |
| 2013/0034695 A1 * | 2/2013 | Smith | B08B 17/065 428/143 |
| 2014/0147627 A1 | 5/2014 | Aizenberg et al. | |

* cited by examiner

COOLANT FLOW DISTRIBUTION USING COATING MATERIALS

TECHNICAL FIELD

The present disclosure relates to the use of coating materials for coolant flow distribution, for example, in electric machines and/or inverters.

BACKGROUND

The power density of electronic devices, such as electric machines and power inverters, is continuously increasing to meet weight and cost reduction targets. To meet these targets, it is generally important to increase the efficiency and performance of the electronic device. The performance and efficiency of electric machines are generally limited by the temperature constraint on the copper windings and/or the maximum current which should overcome the friction losses in the air gap. For electric machine thermal management, it may be important to maintain uniform coolant flow (e.g., water/glycol, oil, or Automatic Transmission Fluid) on the end-windings of the electric machine to remove the localized hot spots. The performance and efficiency of power inverters are generally limited by the thermal constraints in insulated-gate bipolar transistors (IGBTs) and/or diodes because the soldering materials of the components can be damaged by exceeding the temperature limit. For inverter thermal management, a liquid cold plate may be used to cool components, such as IGBTs, diodes, solder layers, etc., inside the inverter.

SUMMARY

In at least one embodiment, a power inverter cold plate is provided. The cold plate may include coolant inlet, a coolant flow spreading region, a coolant flow collection region, and a coolant heat-transfer region disposed therebetween, a coolant outlet, and one or more layers of a hydrophobic or oleophobic coating configured to control a flow of coolant in the cold plate.

The one or more layers may include a plurality of lines in the coolant flow spreading region and/or the coolant flow collection region. The plurality of lines may define a plurality of coolant flow paths. In one embodiment, the plurality of coolant flow paths fan out from the inlet towards the coolant heat-transfer region. In another embodiment, the plurality of coolant flow paths funnel from the coolant heat-transfer region towards the coolant outlet. The cold plate may further include one or more layers of a hydrophilic or oleophilic coating within the plurality of flow paths. In one embodiment, the coolant heat-transfer region may include at least one coolant flow channel having one or more turns, each turn including at least one corner, and at least one of the one or more layers of the hydrophobic or oleophobic coating may be located at or near the at least one corner.

In one embodiment, a layer of the hydrophobic or oleophobic coating is located on each side of the at least one corner. In another embodiment, the one or more turns includes a 180 degree turn having two 90 degree corners and a layer of the hydrophobic or oleophobic coating is located on each side of both 90 degree corners. The coolant heat-transfer region may include at least one coolant flow channel having at least one wall and the cold plate may further include a cover configured to contact a top surface of the at least one wall to retain coolant in the at least one coolant flow channel, and at least one of the one or more layers of the hydrophobic or oleophobic coating may overly the top surface of the at least one wall and may be configured to prevent coolant from passing between the cover and the top surface. In one embodiment, the hydrophobic or oleophobic coating is a super hydrophobic or oleophobic coating having a contact angle of at least 150 degrees with water or oil, respectively.

In at least one embodiment, a method is provided. The method may include applying one or more layers of a hydrophobic or oleophobic coating to a power inverter cold plate to control a flow of coolant in the cold plate, the one or more layers being applied to one or more of a coolant flow spreading region, a coolant flow collection region, or a coolant heat-transfer region disposed therebetween.

In one embodiment, the one or more layers may be applied as a plurality of lines in the coolant flow spreading region and/or the coolant flow collection region. The plurality of lines may be applied to define a plurality of coolant flow paths. The method may include applying one or more layers of a hydrophilic or oleophilic coating within the plurality of coolant flow paths. In one embodiment, the one or more layers are applied to a coolant flow channel in the coolant heat-transfer region having one or more turns, each turn including at least one corner, the one or more layers being applied at or near the at least one corner. In another embodiment, the one or more turns may include a 180 degree turn having two 90 degree corners and a layer of the hydrophobic or oleophobic coating may be applied on each side of both 90 degree corners. The coolant heat-transfer region may include at least one coolant flow channel having at least one wall and the cold plate may further comprise a cover configured to contact a top surface of the at least one wall to retain coolant in the at least one coolant flow channel. At least one of the one or more layers of the hydrophobic or oleophobic coating may be applied to the top surface of the at least one wall and/or to regions of the cover configured to contact the top surface to prevent coolant from passing between the cover and the top surface.

In at least one embodiment, a method is provided. The method may include applying one or more layers of a hydrophobic or oleophobic coating to a coolant flow spreading region, a coolant flow collection region, or a coolant heat-transfer region disposed therebetween of a power inverter cold plate; and introducing a coolant to the cold plate such that the one or more layers control a flow of the coolant in the cold plate.

In one embodiment, the one or more layers may control the flow of the coolant to do one or more of the following: spread the coolant in the flow spreading region from a coolant inlet to the coolant heat transfer region; funnel the coolant in the coolant flow collection region from the coolant heat-transfer region to a coolant outlet; prevent coolant recirculation zones in a corner of a coolant flow channel in the coolant heat-transfer region; or prevent coolant from passing between a cold plate cover and a top surface of a wall in the coolant heat-transfer region.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1A:
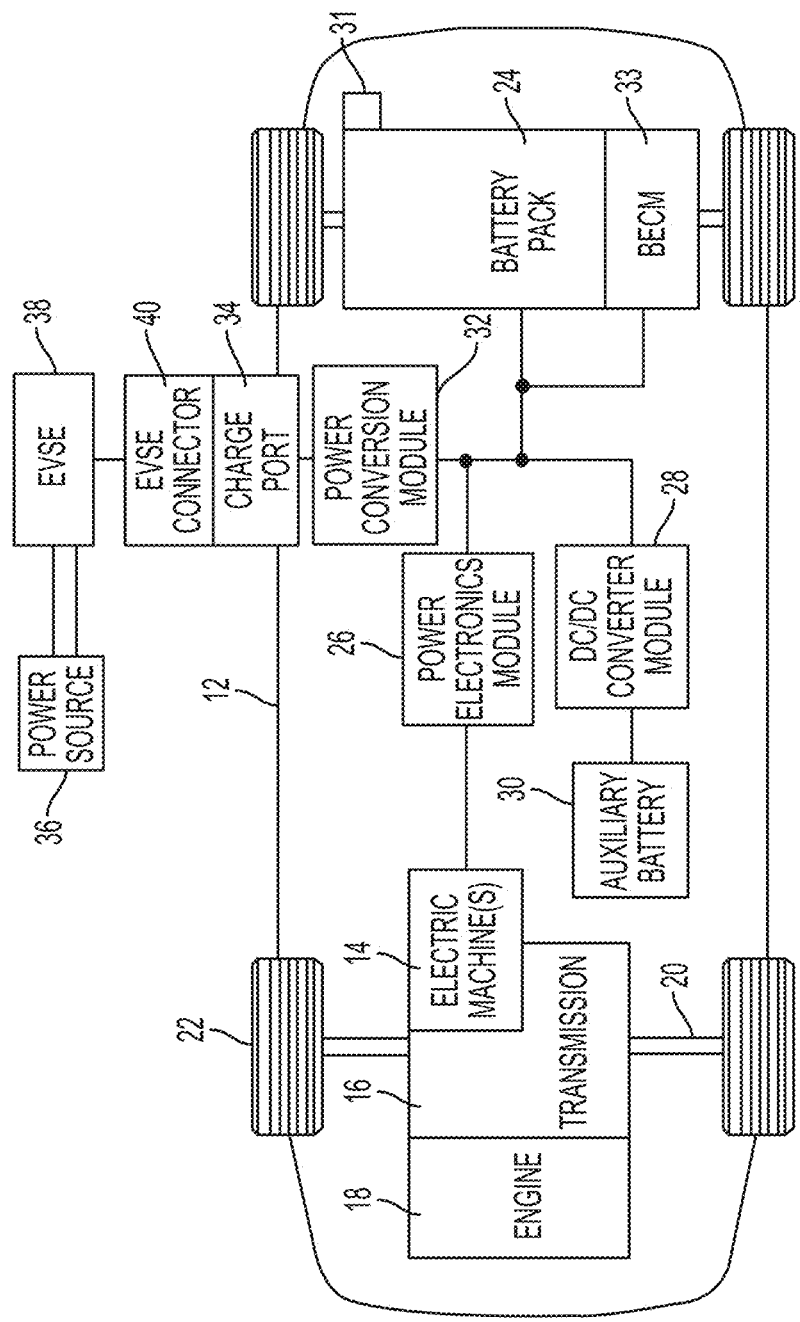
FIG. 1A is a schematic diagram illustrating an example of an electrified vehicle.

FIG. 1A depicts a schematic of an example of a PHEV, referred to as a vehicle 12 herein. The vehicle 12 may comprise one or more electric machines 14 mechanically connected to a hybrid transmission 16. The electric machines 14 may be capable of operating as a motor or a generator. In addition, the hybrid transmission 16 may be mechanically connected to an engine 18. The hybrid transmission 16 may also be mechanically connected to a drive shaft 20 that is mechanically connected to a set of wheels 22. The electric machines 14 can provide propulsion and deceleration capability when the engine 18 is turned on or off. The electric machines 14 may also act as generators and may provide fuel economy benefits by recovering energy that would normally be lost as heat in the friction braking system. The electric machines 14 may also provide reduced pollutant emissions since the hybrid-electric vehicle 12 may be operated in electric mode or hybrid mode under certain conditions to reduce overall fuel consumption of the vehicle 12.

A traction battery or battery pack 24 stores and provides energy that may be used by the electric machines 14. The traction battery 24 may provide a high voltage DC output from one or more battery cell arrays, sometimes referred to as battery cell stacks, within the traction battery 24. The battery cell arrays may include one or more battery cells. The traction battery 24 may be electrically connected to one or more power electronics modules 26 through one or more contactors (not shown). The one or more contactors isolate the traction battery 24 from other components when opened and connect the traction battery 24 to other components when closed. The power electronics module 26 may also be electrically connected to the electric machines 14 and provides the ability to bi-directionally transfer electrical energy between the traction battery 24 and the electric machines 14. For example, the traction battery 24 may provide a DC voltage while the electric machines 14 may require a three-phase AC voltage to function. The power electronics module 26 may convert the DC voltage to a three-phase AC voltage as required by the electric machines 14. In a regenerative mode, the power electronics module 26 may convert the three-phase AC voltage from the electric machines 14 acting as generators to the DC voltage required by the traction battery 24. Portions of the description herein are equally applicable to a pure electric vehicle. For a pure electric vehicle, the hybrid transmission 16 may be a gear box connected to an electric machine 14 and the engine 18 may not be present.

In addition to providing energy for propulsion, the traction battery 24 may provide energy for other vehicle electrical systems. A DC/DC converter module 28 may convert high voltage DC output of the traction battery 24 to a low voltage DC supply that is compatible with other vehicle loads. Other high-voltage loads, such as compressors and electric heaters, may be connected directly to the high-voltage without the use of the DC/DC converter module 28. The low-voltage systems may be electrically connected to an auxiliary battery 30 (e.g., 12V battery).

A battery electrical control module (BECM) 33 may be in communication with the traction battery 24. The BECM 33 may act as a controller for the traction battery 24 and may also include an electronic monitoring system that manages temperature and charge state of each of the battery cells. The traction battery 24 may have a temperature sensor 31 such as a thermistor or other temperature gauge. The temperature sensor 31 may be in communication with the BECM 33 to provide temperature data regarding the traction battery 24. The temperature sensor 31 may also be located on or near the battery cells within the traction battery 24. It is also contemplated that more than one temperature sensor 31 may be used to monitor temperature of the battery cells.

The vehicle 12 may be, for example, an electrified vehicle which includes components for a PHEV, a FHEV, a MHEV, or a BEV. The traction battery 24 may be recharged by an external power source 36. The external power source 36 may be a connection to an electrical outlet. The external power source 36 may be electrically connected to electric vehicle supply equipment (EVSE) 38. The EVSE 38 may provide circuitry and controls to regulate and manage the transfer of electrical energy between the power source 36 and the vehicle 12. The external power source 36 may provide DC or AC electric power to the EVSE 38. The EVSE 38 may have a charge connector 40 for plugging into a charge port 34 of the vehicle 12. The charge port 34 may be any type of port configured to transfer power from the EVSE 38 to the vehicle 12. The charge port 34 may be electrically connected to a charger or on-board power conversion module 32. The power conversion module 32 may condition the power supplied from the EVSE 38 to provide the proper voltage and current levels to the traction battery 24. The power conversion module 32 may interface with the EVSE 38 to coordinate the delivery of power to the vehicle 12. The EVSE connector 40 may have pins that mate with corresponding recesses of the charge port 34. The various components discussed may have one or more associated controllers to control and monitor the operation of the components. The controllers may communicate via a serial bus (e.g., Controller Area Network (CAN)) or via discrete conductors.

Current examples of thermal management assemblies for electric machines may introduce oil to portions of the electric machine for cooling purposes. The oil may be dripped or sprayed onto wire end windings of the electric machine. However, this practice may not be very effective in cooling the end windings due to a non-uniformity of coolant flow as applied to the end windings. An air cooled thermal management assembly is another example of an assembly to assist in managing thermal conditions of an electric machine. In this example, a fan or blower may be located adjacent the end windings to push air thereto for cooling purposes.

Figure 1B:
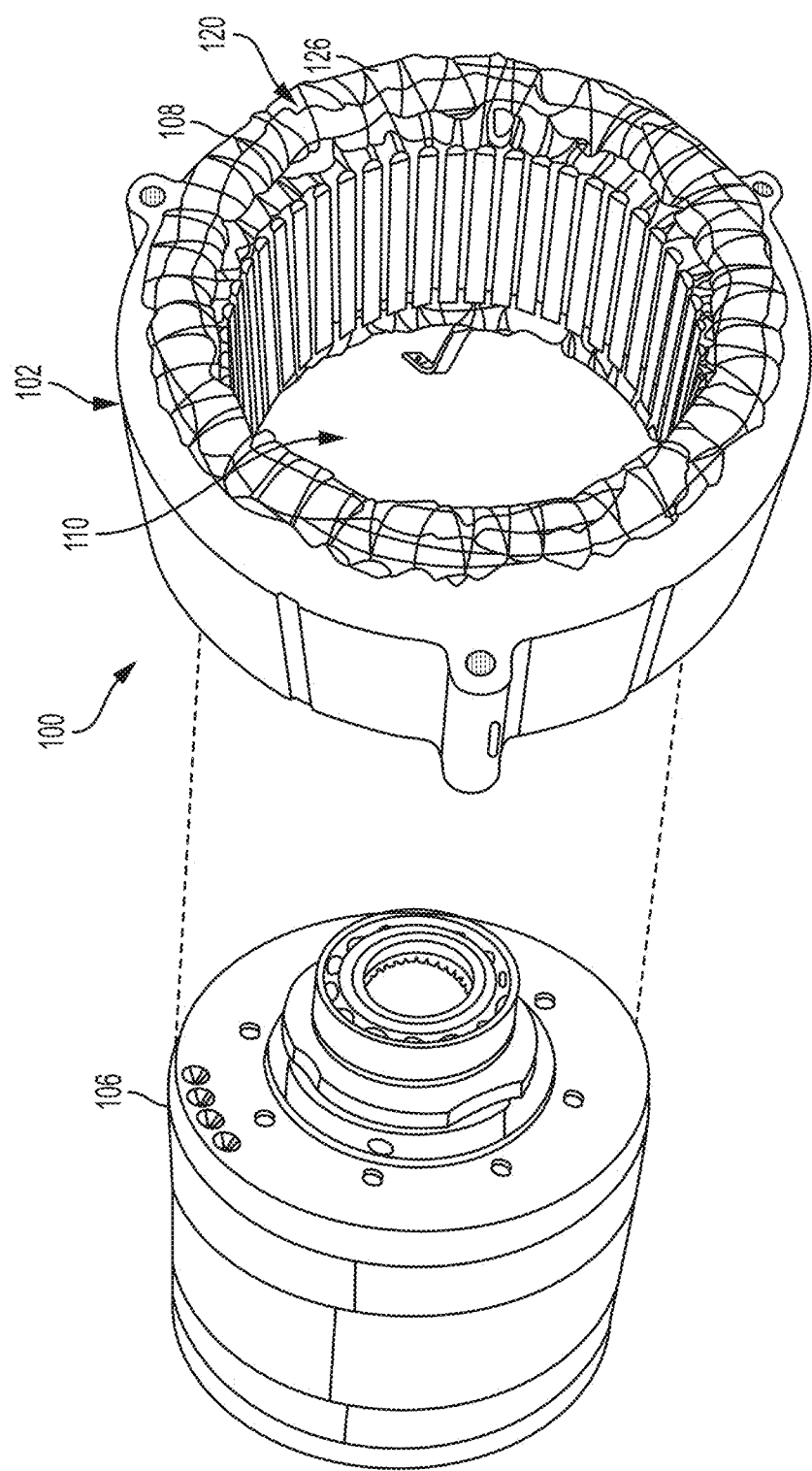
FIG. 1B is a perspective view of an example of an electric machine.

FIG. 1B shows an example of an electric machine for an electrified vehicle, referred to generally as an electric machine 100 herein. The electric machine may include a stator core 102 and a rotor 106. Electrified vehicles may include two electric machines. One of the electric machines may function primarily as a motor and the other may function primarily as a generator. The motor may operate to convert electricity to mechanical power and the generator may operate to convert mechanical power to electricity. The stator core 102 may define an inner surface 108 and a cavity 110. The rotor 106 may be sized for disposal and operation within the cavity 110. A shaft (not shown) may be operably connected to the rotor 106 to drive rotation thereof.

Windings 120 may be disposed within the cavity 110 of the stator core 102. In an electric machine motor example, current may be fed to the windings 120 to obtain a rotation force on the rotor 106. In an electric machine generator example, current generated in the windings 120 by a rotation of the rotor 106 may be removed to power vehicle components. Portions of the windings 120, referred to as end windings 126 herein, may protrude from the cavity 110. During operation of the electric machine 100, heat may be generated along the windings 120 and end windings 126.

Figure 2:
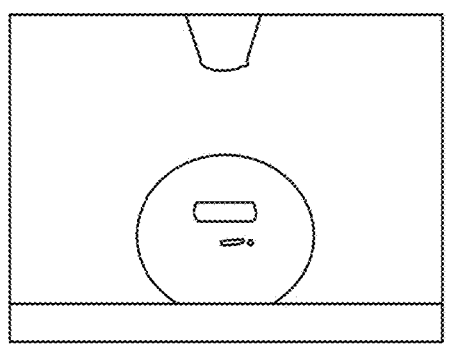
FIG. 2 is a schematic of a droplet of water on a super hydrophobic or super oleophobic coating surface having a contact angle of at least 150 degrees.

In at least one embodiment, the present disclosure includes the application of a coating or coatings to affect, alter, and/or control coolant distribution on an electronic device, such as an electric machine or a power inverter. The coating(s) may be a (super) hydrophobic and/or (super) oleophobic coating or a (super) hydrophilic and/or (super) oleophilic coating. Hydrophobic and oleophobic coatings are those that repel or have a very high contact angle with water and oil, respectively. Hydrophilic and oleophilic coatings are those that attract or have a very low contact angle with water and oil, respectively. With reference to FIG. 2, a schematic of a droplet of water or oil (e.g., automatic transmission fluid, ATF) is shown on a super hydrophobic/oleophobic coating. As shown, the droplet forms almost a perfect sphere on the coating due to its repellence. Super hydrophobic/oleophobic coatings may cause droplets of water/oil to form contact angles of 150 degrees or higher with the coating. In contrast, on super hydrophilic and oleophilic coatings, droplets spread out and form an almost even layer on top of the coating. Super hydrophilic/oleophilic coatings may cause droplets of water/oil to form contact angles of 25 degrees or lower with the coating.

Any suitable hydrophobic, oleophobic, super hydrophobic, or super oleophobic coatings may be used in accordance with the present disclosure. In general, such coatings may have a high contact angle with the water or oils. Hydrophobic/oleophobic materials may generally be those forming a contact angle of at least 90 degrees, such as at least 100, 110, 120, 130, or 140 degrees, while super hydrophobic/oleophobic materials may generally be those forming a contact angle of at least 150 degrees with water/oil. The coatings may form such high contact angles as a result of a nano-scale surface structure. For example, the surface of the coating may be covered in very small projections, making the coating rough on a nano-scale. The gaps between the projections may trap air and make it energetically unfavorable for liquids to wet the surface. Similarly, any suitable hydrophilic, oleophilic, super hydrophilic, or super oleophilic coatings may be used in accordance with the present disclosure. In general, such coatings may have a low contact angle with the water or oils. Hydrophilic/oleophilic materials may generally be those forming a contact angle of at most 50 degrees, such as at most 40 or 30 degrees, while super hydrophilic/oleophilic materials may generally be those forming a contact angle of 25 degrees or less with water/oil.

Examples of various (super) hydrophobic/oleophobic and (super) hydrophilic/oleophilic compositions and treatment methodologies are provided in U.S. Patent Publication Nos. 2013/0109261, 2012/0009396, 2010/0314575, 2012/0045954, and 2006/0029808, and also in U.S. Pat. Nos. 8,007,638, 6,103,379, 6,645,569, 6,743,467, 7,985,451, 8,187,707, 8,202,614, 7,998,554, 7,989,619, 5,042,991, 8,361,176, 8,258,206, 6,458,867, 6,503,958 and 6,723,378, and also in International Publication No. WO2013/058843, the disclosures of which are incorporated herein by reference.

The (super) hydrophobic/oleophobic coating may be applied to the electronic device using any suitable method, which may depend on the composition of the coating itself. In one embodiment, the coating may be applied by spraying. In another embodiment, the coating may be applied using a form of deposition, such as physical vapor deposition (PVD) or chemical vapor deposition (CVD). In another embodiment, the coating may be physically transferred to the electronic device, such as by rolling or brushing. Regardless of the method of application, masks may be used to only coat certain desired areas or regions.

Figure 3:
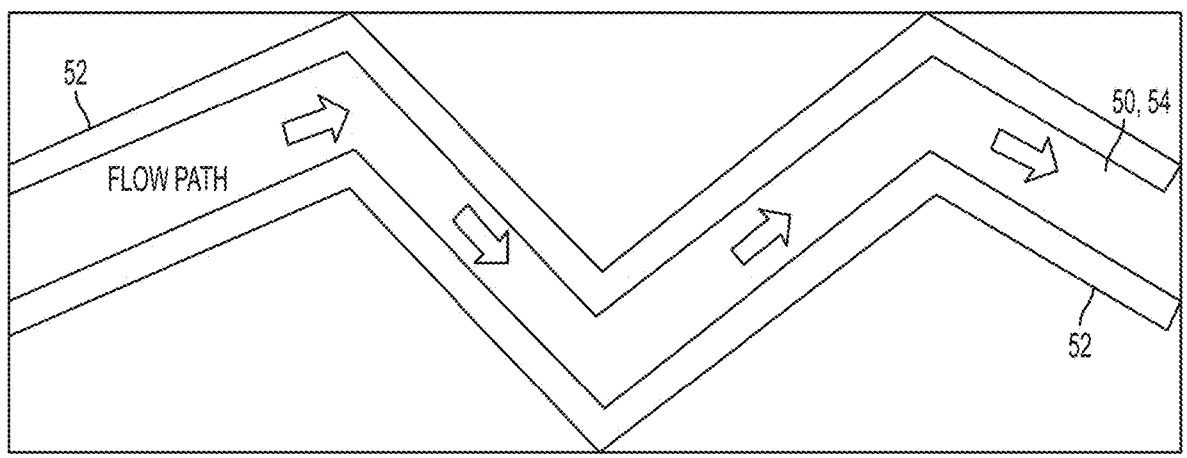
FIG. 3 is a top view of an example of a coolant channel formed between two repellant coating.
Figure 4:
FIG. 4 is a photograph of a coolant channel formed by a repellant coating, according to one example.

With reference to FIGS. 3 and 4, a schematic example and an experimental sample are shown of a hydrophobic/oleophobic (herein after, "repellant") coating forming a flow path 50 for a liquid, such as a coolant (e.g., water or ATF). The flow path 50 may be formed by one or more lines, strips, layers, or areas 52 of the repellant coating. In the example shown in FIG. 3, two spaced apart lines 52 form the flow path 50. The lines 52 may be evenly spaced to form a flow path 50 having a constant or substantially constant width. However, in other embodiments, the flow path 50 may have a non-constant width. The lines 52 may be configured to form a flow path 50 having any shape or pattern. In the embodiment shown in FIG. 3, the lines 52 for a zig-zag flow path 50, which may also be referred to as a sinuous, serpentine, winding, or oscillating flow path 50.

In at least one embodiment, the line(s) 52 of the repellant coating may form the flow path 50 without any raised walls or sunken/carved channels. That is, the flow path 50 may be formed due solely to the repellence of the liquid (e.g., coolant) from the coating. The use of the lines, strips, etc. of the repellant coating may therefore allow for control or influence of the flow of coolant without the need for relatively large physical barriers, such as channels walls or channels trenches or troughs. Instead, a thin coating may be used to control/influence the flow of coolant. As shown in FIG. 4, the coating may be very thin so as to be essentially even or flush with the surface applied thereto relative to the height of the coolant being controlled. For example, the coating may have a thickness of less than 1 mm, such as less than 500 µm, 250 µm, 100 µm, 50 µm, 25 µm, or 15 µm.

In at least one embodiment, in addition to the line(s) 52 of the repellant coating, a hydrophilic or oleophilic coating 54 may also be applied to form the flow path 50. In one embodiment, at least a portion of the area of the flow path 50 may be coated with the hydrophilic or oleophilic coating (herein after "wetting coating"). For example, the entire area of the flow path 50 may be coated with the wetting coating. In another embodiment, lines of the wetting coating may be applied within the flow path 50. For example, lines may be applied that are parallel to the lines 52 of the repellant coating. Accordingly, the wetting coating may help further control the flow of a coolant in the flow path. The lines 52 of the repellant coating may form an outer boundary of the flow path 50 while the wetting coating encourages the coolant to flow across it in the desired direction.

With reference to FIGS. 5A-5F, examples of different shapes and patterns of flow paths 50 that may be formed using the repellant coating are shown. The patterns shown are merely examples, however, and other patterns may be formed depending on the desired flow path. FIG. 5A shows a straight flow path 50 having a constant width, which may be formed by spaced apart parallel lines 52 of repellant coating. FIG. 5B shows a zig-zag flow path 50, which may also be referred to as a sinuous, serpentine, winding, or oscillating flow path 50. This flow path may be formed by spaced apart lines 52. Segments of the lines 52 may be parallel, such that the flow path 50 has a constant width, however, this is not required. FIG. 5C shows a contracting flow path 50, in which the width of the flow path becomes smaller in one direction (e.g., from top to bottom, as shown). FIG. 5D shows an expanding flow path 50, in which the width of the flow path becomes larger in one direction (e.g., from top to bottom, as shown). FIG. 5E shows a flow path 50 that contracts or narrows over a certain distance and then the contraction stops at an inflection point and then expands or widens. This may be referred to as an hourglass flow path. FIG. 5F shows a flow path 50 that expands or widens over a certain distance and then the expansion stops at an inflection point and then contracts or narrows. This may be referred to as a bulging flow path. Similar to above with respect to FIGS. 3-4, a wetting coating 54 may also be applied in the flow path 50, however, it is not required.

Figure 5:
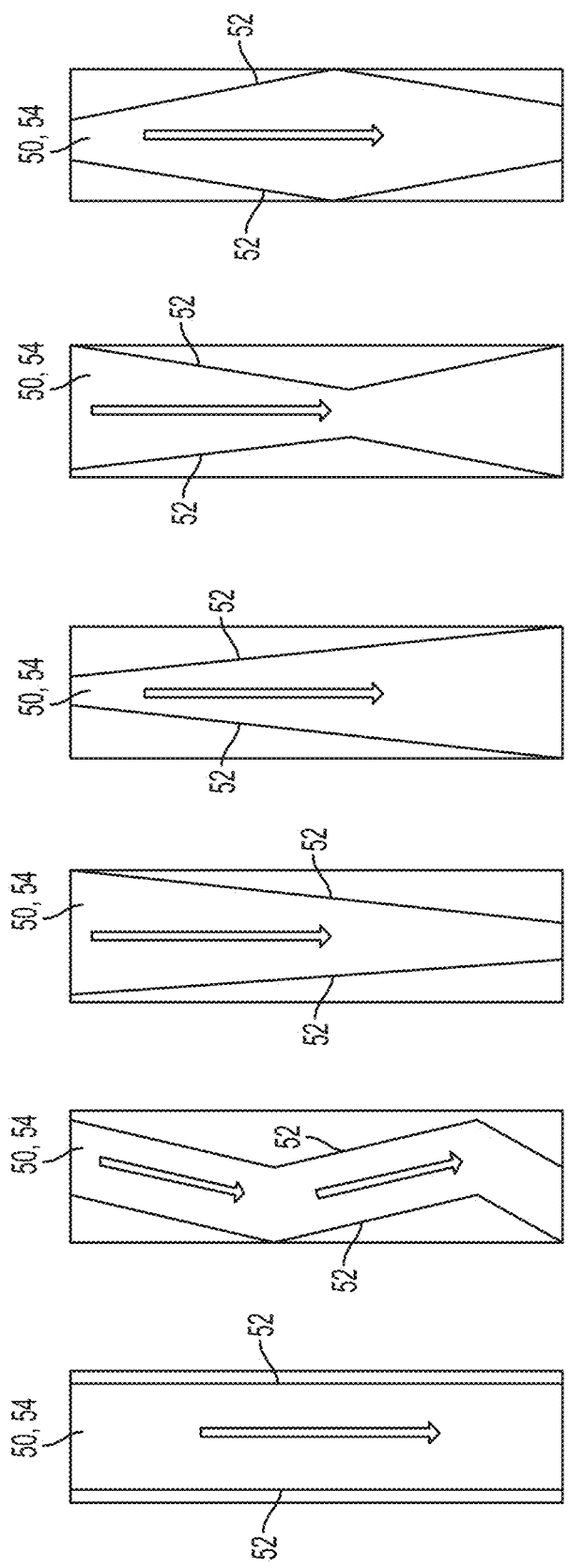
FIGS. 5A, 5B, 5C, 5D, 5E, and 5F are examples of coolant channel shapes or patterns that may be formed using a repellant coating, including a straight, zig-zag, contracting, expanding, contracting-to-expanding, and expanding-to-contracting, respectively.

The examples shown and described with reference to FIGS. 3-5 relate to flow paths in which there are two spaced apart lines or strips of coating to form one flow path. However, there may be fewer lines (e.g., one) or there may be more lines (e.g., three or more) to control the flow of a liquid, such as coolant. For example, a single line 52 may be applied to a surface in order to prevent or reduce the flow of liquid from passing that line and/or to keep the liquid on one side of the line. In other examples, three or more lines 52 may be applied to a surface to create multiple flow paths 50. In one embodiment, a single flow path 50 may be split into multiple flow paths, such as two (bifurcated), three (trifurcated), or more flow paths. Of course, multiple sets of lines 52 may also be used to form a plurality of discrete flow paths 50. Similarly, lines, layers, or strips of the wetting coating 54 may be applied to attract or encourage coolant to flow in a direction or path of the coating 54. The wetting coating 54 may be used in conjunction with the repellant coating for even greater control of the coolant flow.

In at least one embodiment, the repellant coating may be used to form one or more coolant flow paths 50 on an electric machine, such as electric machine 100. For example, the repellant coating may be used to form flow paths 50 on the windings 120, such as the end windings 126 of an electric machine. During operation of an electric machine, coolant, such as an oil-based coolant (e.g., ATF), may be introduced onto the end windings 126 to remove heat therefrom. The coolant may be introduced onto the end windings 126 in a variety of ways, depending on the design of the particular electric machine. In some designs, coolant may be pumped or otherwise released onto the end windings 126. The coolant may be introduced at the top of the end windings or on an upper portion of the end windings and allowed to fall by gravity to cool the lower portion of the end windings.

Figure 6:
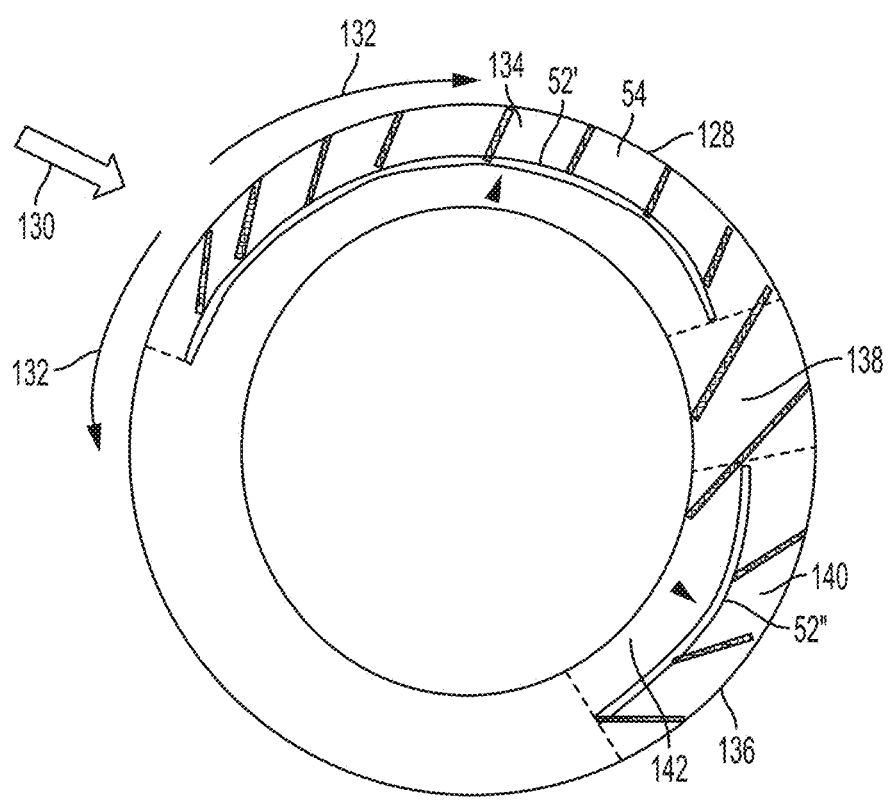
FIG. 6 is an end view of stator end windings including a line of repellant coating and a resulting effect on coolant flow, according to an embodiment.

With reference to FIG. 6, a schematic example of an end view of an electric machine end windings 126 is shown. In the example shown, coolant may be introduced onto a top portion 128 of the end windings 126 on one side of center, as indicated by the arrow 130. The coolant may be introduced at an angle, such that the coolant flow has a horizontal and a vertical component when it contacts the end windings 126. This may cause the coolant to flow around the top of the end windings 126 and onto the opposite side, as well as down the side on which the coolant was introduced, as indicated by arrows 132.

In one embodiment, the repellant coating may be applied to the end windings 126 in order to control or affect the flow of the coolant over the end windings 126. The repellant coating may be used to form flow paths that provide more uniform coolant flow over the end windings than if no coating were present. The repellant coating may also be used to channel or guide coolant to areas requiring increased cooling or areas that would receive insufficient cooling if the coolant flow was not adjusted. For example, areas that receive insufficient cooling may form areas called "hot spots." Other areas that may require or benefit from additional coolant flow may include the neutral point. The neutral point may be the connection of all three phase wires for a three phase electric motor. Since the neutral point joins all wires at one point, heat can be concentrated at that point and may form a type of hot spot.

In the embodiment shown in FIG. 6, lines 52 of the repellant coating are applied to increase the coolant flow in certain portions of the end windings 126. The lines 52 may be arranged as arcs extending around the end windings. For example, the arcs may be concentric with the end windings (e.g., circular or circular segments sharing a center with the end windings). In the embodiment shown, one line 52' may be positioned in a top portion 128 of the end windings and may be a concentric arc that is at or near the midpoint of the end windings (e.g., halfway between the inner and outer radius of the end windings). As shown in FIG. 6, this line 52' may increase the coolant flow in a region 134 above the line 52'. Due to the repellant nature of the coating (e.g., oleophobic), the coolant, such as ATF, may remain above the line 52' on end windings 126 instead of immediately falling or dipping downward due to the force of gravity. Instead, the coolant may flow along the top of the end windings 126 and down the side opposite from where the coolant was introduced (e.g., arrow 130). The line 52' of repellant coating may therefore increase the coolant flow and/or the time the end windings in region 134 are in contact with the coolant, resulting in improved heat removal in region 134. Similar to above, the region 134 may also include a line, layer, strip, etc. of a wetting coating 54 to further encourage the coolant to flow thereon. A portion of all of the region 134 may be coated with the wetting coating 54.

In addition to, or instead of, the line 52', one or more additional lines 52 may also be applied to the end windings 126. For example, a line 52" may be applied to a bottom portion 136 of the end windings 126. Similar to line 52', line 52" may be an arc and may be concentric with the end windings. Line 52" may also be at a midpoint of the windings. In the embodiment shown, the line 52" may be located on a side of the end windings opposite the side where coolant is introduced (e.g., arrow 130). However, the line 52" may be located on the same side as the coolant or centered, similar to line 52'. Positioning the line 52" on the opposite side of the coolant inlet may further facilitate even or uniform coolant flow, particularly if line 52' is present. Line 52" may cause the coolant that stayed above line 52' to continue to move horizontally across the end windings 126 rather than dripping vertically downward. There may be a gap region 138 between line 52' and line 52". The gap region may be located in a middle region of the height of the end windings 126. When the coolant from region 134 flows down the end windings, some of the coolant will be further guided radially outward to a region 140 by the line 52" while some coolant will be guided radially inward by the line 52" to a region 142. Similar to the coolant being maintained above line 52', the coolant in region 142 may be maintained above line 52" instead of flowing downward. This may increase the flow of coolant to the end windings in this area and/or increase the contact time of the coolant with the windings in the area. Regions 140 and/or 142 may have a wetting coating 54 applied thereon, similar to region 134.

While two lines 52' and 52" are shown and described in FIG. 6, there may be fewer (e.g., one) or more (e.g., three or greater) lines 52. Based on the present disclosure, one of ordinary skill in the art will understand that the lines 52 may be positioned in order to guide or increase contact time of the coolant with areas of the end windings 126 that may benefit from it, based on the design of the particular electric machine. While the lines 52 are shown as solid lines, they may be dashed or intermittent, such that there are gaps in the lines that allow some coolant to flow through. This may allow for the end windings on the other side of the lines to still receive coolant flow. In addition, while the coating may prevent a certain volume or flow of coolant from crossing the lines, at a certain volume or flow rate, a portion of the coolant may cross the line due by overcoming the repellant force.

Figure 8:
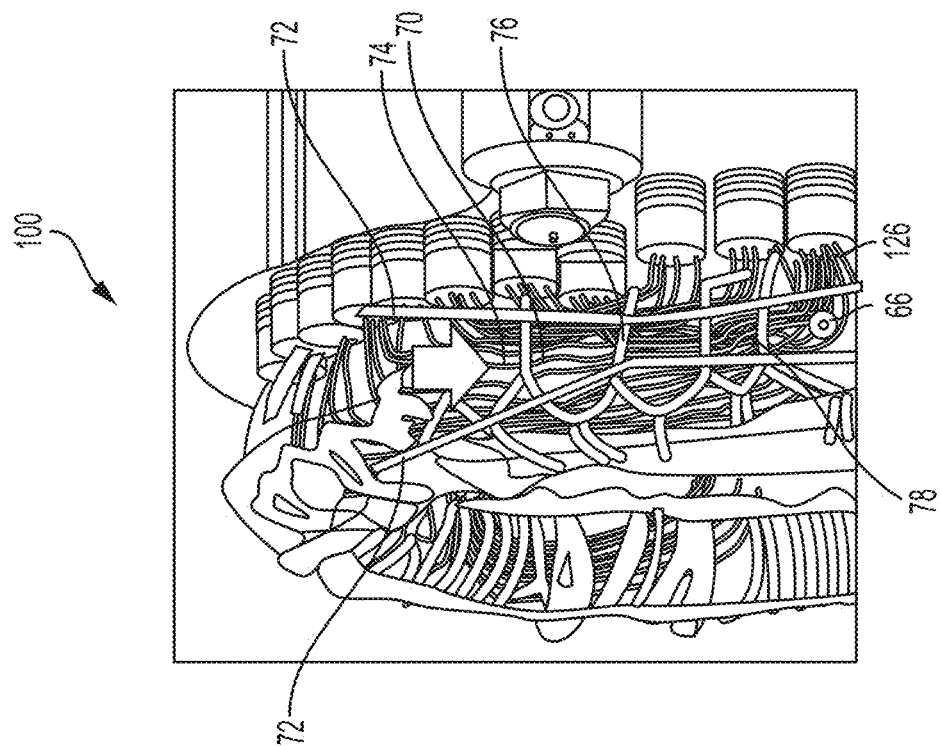
FIG. 8 is a perspective view of stator end windings having a repellant coating applied thereon to form a contracting-to-expanding (e.g., hourglass) coolant flow path, according to an embodiment.
Figure 7:
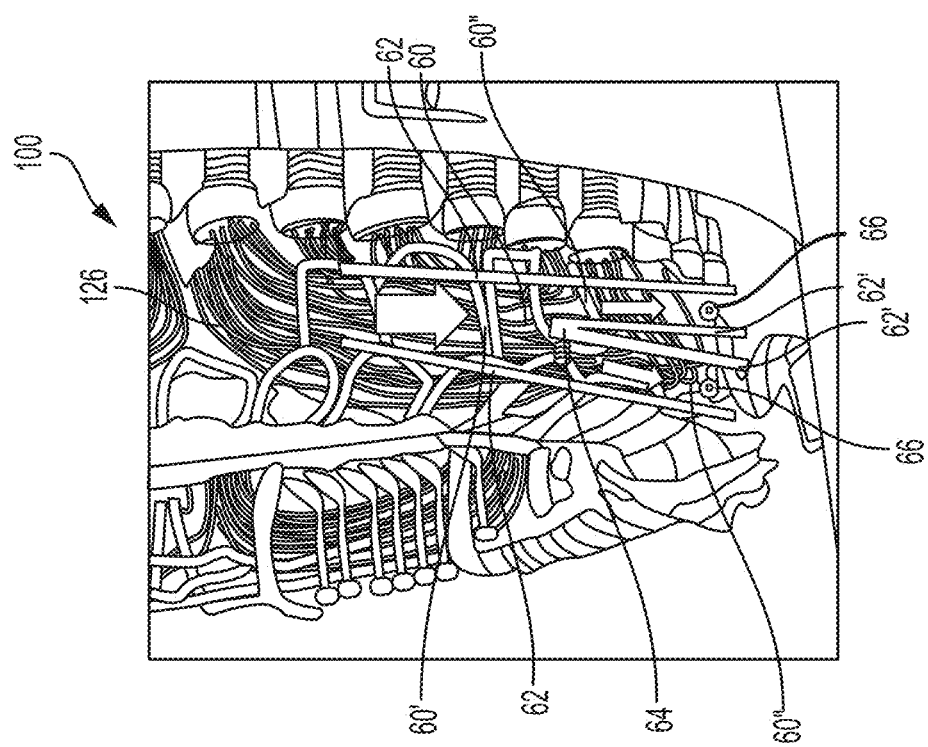
FIG. 7 is a perspective view of stator end windings having a repellant coating applied thereon to form a forked coolant flow path, according to an embodiment.
Figure 9:
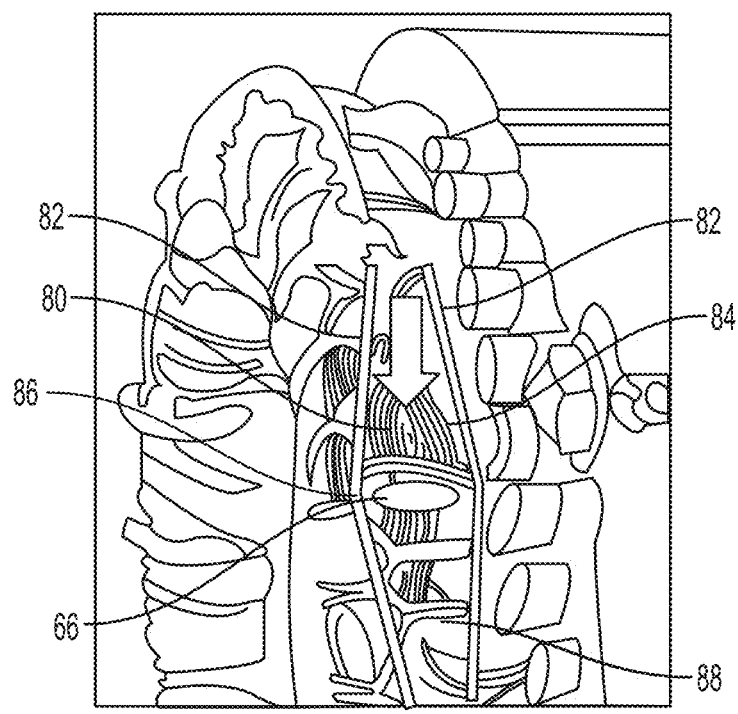
FIG. 9 is a perspective view of stator end windings having a repellant coating applied thereon to form an expanding-to-contracting flow path, according to an embodiment.

With reference to FIGS. 7-9, additional examples of repellant coatings used to affect coolant flow are shown. The Embodiments shown each include at least two lines 62 of the repellant coating to form at least one flow path 60 on the end windings 126 of an electric machine 100. In the embodiment of FIG. 7, the flow path 60 may include a single flow portion 60' that is split or bifurcated into two secondary flow paths 60". The flow path 60 may include two spaced apart outer lines 62 of repellant coating that may define the outer boundaries of both the single flow portion 60' and the secondary flow paths 60". Two inner lines 62' may be disposed between the outer lines 62 and for define the inner boundaries of the secondary flow paths 60". The inner lines 62' may begin at an intersection 64 and branch out from each other to form the inner boundaries of the secondary flow paths 60". Accordingly, in the embodiment shown in FIG. 7, coolant may flow down from the top of the end windings 126 through the single flow portion 60' of the flow path 60 and then may be split into two secondary flow paths 60" at a bottom portion of the end windings 126. However, it is to be understood that the particular orientation of the flow paths and the location of the split are merely examples and not limiting. For example, the secondary flow paths 60" could be facing the top of the windings, receive the coolant separately, and then funnel it to a single flow portion 60' at a bottom portion of the windings.

As shown in FIG. 7, the secondary flow paths 60" may be configured to direct coolant such that it contacts and/or flows over a hot spot 66. As known to those of ordinary skill in the art, hot spots may occur in the windings for a variety of reasons. Hot spots may occur due to factors such as the winding pattern, the density of the windings, the current density, exposure to air or coolants, proximity to the central windings or other heat sinks, or other factors. Based on the design of the electric machine, the hot spot(s) 66 may be in predictable locations. Accordingly, the flow path(s) 60 may be configured such that extra coolant is delivered to the hot spots 66 or so that the hot spots 66 receive similar coolant flow to other areas of the windings. As shown in FIG. 7, the secondary flow paths 60" may each be configured to guide coolant to a hot spot 66. Similar to above with respect to FIGS. 3-4, a wetting coating may also be applied within the flow paths 60, 60', and/or 60" to further encourage coolant to flow therethrough.

With reference to FIG. 8, an embodiment is shown in which two spaced apart lines 72 of repellant coating form a flow path 70 on the end windings 126 of an electric machine 100. In this embodiment, the spacing between the lines 72 changes as the lines extend from a top portion of the end windings towards a bottom portion of the end windings. The line spacing may decrease along a first region 74 of the end windings such that the flow path 70 narrows in the first region 74. At an inflection point 76, the line spacing (e.g., flow path width) may be at a (local) minimum and the line spacing may begin to increase to form a second region 78 in which the flow path 70 widens. This line spacing pattern may be referred to as a contracting-to-expanding pattern or an hourglass pattern. Similar to FIG. 7, the pattern of the flow path 70 may be configured to guide coolant to a hot spot 66, shown in FIG. 8 as located within the second region 78 (e.g., expanding portion). Similar to above with respect to FIGS. 3-4, a wetting coating may also be applied within the flow path 70 to further encourage coolant to flow therethrough.

With reference to FIG. 9, an embodiment is shown in which two spaced apart lines 82 of repellant coating form a flow path 80 on the end windings 126 of an electric machine 100. In this embodiment, the spacing between the lines 82 changes as the lines extend from a top portion of the end windings towards a bottom portion of the end windings. The line spacing may increase along a first region 84 of the end windings such that the flow path 80 widens in the first region 84. At an inflection point 86, the line spacing (e.g., flow path width) may be at a (local) maximum and the line spacing may begin to decrease to form a second region 88 in which the flow path 80 narrows. This line spacing pattern may be referred to as an expanding-to-contracting pattern or a bulging pattern. Similar to FIGS. 7 and 8, the pattern of the flow path 80 may be configured to guide coolant to a hot spot 66, shown in FIG. 9 as located at or near the inflection point 86 (e.g., bulging portion). Similar to above with respect to FIGS. 3-4, a wetting coating may also be applied within the flow paths 60, 60', and/or 60" to further encourage coolant to flow therethrough.

In the embodiments described above, the end windings (e.g., copper windings) are described as being covered or coated by a repellant coating, however, the coating may also extend over other accessory or ancillary materials or components related to the end windings. For example, the accessory or ancillary materials may include support materials or fasteners, such as straps or ties that hold the metal (e.g., copper) windings in place. These materials may be disposed on an outer surface of the end windings to secure them. Accordingly, the lines of the repellant coating, such as lines 52, 62, 72, and 82 may traverse over both the metal windings and the support materials to form the flow paths (e.g., 50, 60, 70, 80). The flow paths may therefore also extend over both the metal windings and the support materials. Therefore, as used herein, a line, strip, etc. of the coating that is described as extending over windings or end windings may also extend over accessory or ancillary materials associated therewith.

Figure 10:
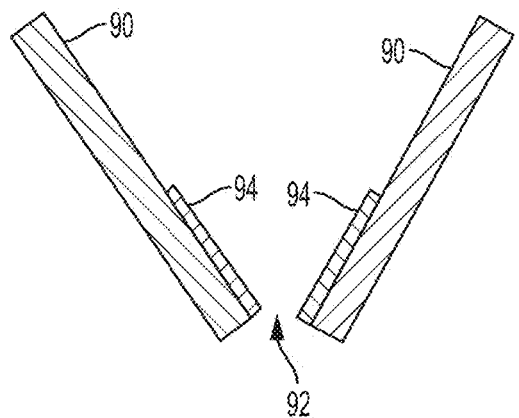
FIG. 10 is an end view of two adjacent windings each having a repellant coating thereon to prevent coolant from falling through a gap therebetween, according to an embodiment.
Figure 11:
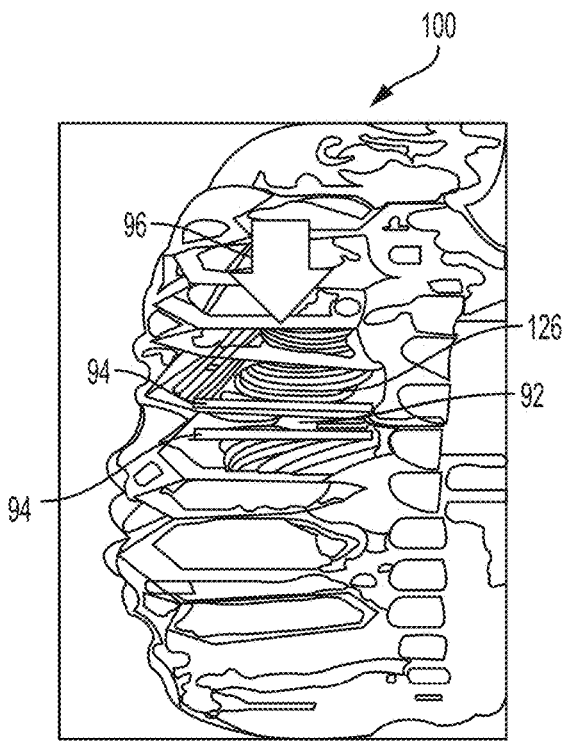
FIG. 11 is a side view of stator end windings having a repellant coating thereon to prevent coolant from falling through a gap therebetween, according to an embodiment.
Figure 12:
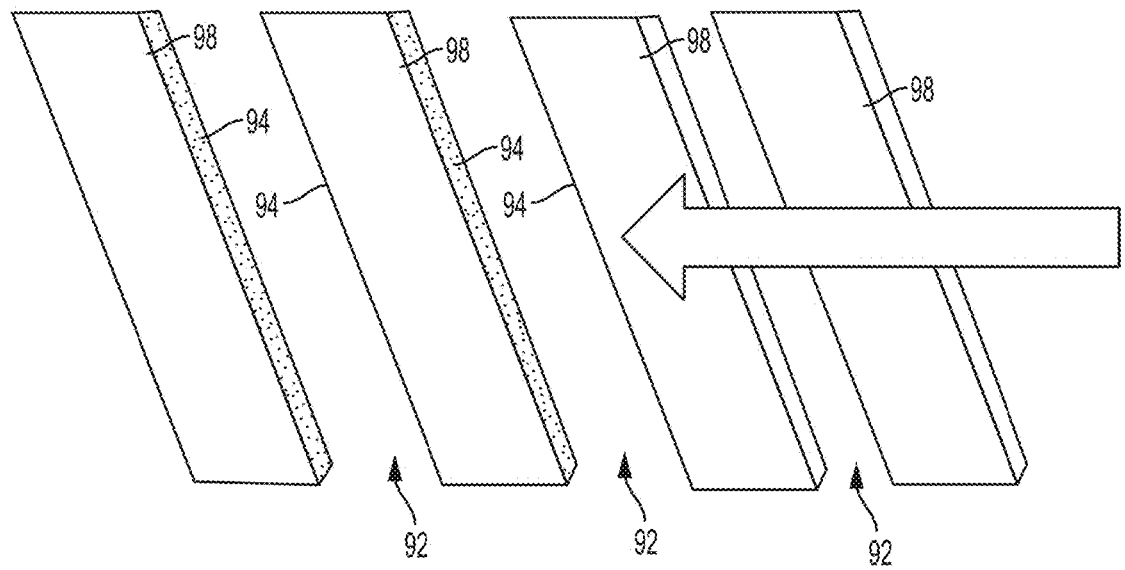
FIG. 12 is a perspective view of hairpin end windings having a repellant coating thereon to prevent coolant from falling through a gap therebetween, according to an embodiment.

With reference to FIGS. 10-12, the repellant coating may also be used for preventing a liquid (e.g., a coolant, such as water or oil) from falling or passing through gaps or channels between two surfaces. The two surfaces may be surfaces of components of an electric machine, such as electric machine 100. For example, the surfaces may be on adjacent windings (e.g., end windings) or adjacent metal bars (e.g., copper bars). In the embodiment shown in FIG. 10, there are two adjacent surfaces 90 shown in transverse cross-section. The surfaces 90 may be slanted towards each other such that a gap 92 between them is narrower at their bottoms than at their tops. Accordingly, absent any barrier, a liquid (e.g., a coolant) would flow between the two surfaces and fall through the gap 92 at the bottom. However, by applying a layer 94 of the repellant coating at or near the bottom of each surface 90, the coolant may be prevented from falling through the gap 92 (or a lesser amount may fall through). Applying the layers 94 may therefore allow coolant to flow over gaps between two surfaces, which may increase the flow on top of and/or across the surfaces.

With reference to FIG. 11, a side perspective view of end windings 126 of an electric machine 100 are shown. An arrow 96 indicates a flow of coolant around the circumference of the end windings 126. Similar to above, absent a barrier, the coolant may be free to fall through gaps 92 between individual bundles of windings, which may reduce the coolant contact time with the windings and reduce the heat removal from the windings. However, if a layer 94 of the repellant coating is applied on either side of the gap 92, then the coolant (e.g., ATF) may be prevented from falling through the gap 92, or a reduced amount of coolant may fall through the gap 92. While a single pair of layers 94 is shown in FIG. 11, there may be a plurality of pairs of layers 94. For example, each gap 92 may have a layer 94 on either side. Alternatively, certain gaps 92 may have a layer 94 on each side, such as those that tend to have a lot of coolant fall therethrough or in areas where increased coolant contact time is desired. In one embodiment, a plurality of gaps 92 on a top half of the end windings 126 may include a layer 94 on either side to encourage coolant flow around the circumference of the windings instead of immediately falling through them. Similar to above with respect to FIGS. 3-4, a wetting coating may also be applied to the end windings 126 to further encourage coolant to flow along the path of arrow 96. For example, the wetting coating may be applied parallel to the arrow 96 and/or perpendicular to the layers 94 of the repellant coating.

With reference to FIG. 12, a schematic of a different style of end windings 126 are shown, known as hairpin windings. Hairpin windings are known in the art as a type of winging and will not be described in detail. In general, the copper wires of a conventional winding may be replaced with metal (e.g., copper) strips or bars 98. Similar to the bundles of windings shown in FIG. 11, there may be gaps 92 between adjacent strips 98 through which coolant may fall. Accordingly, layers 94 of the repellant coating may be applied to the strips 98 on either side of the gaps 92 to prevent coolant from falling through, or to reduce the amount that falls through. The layers 94 may be applied to the side edges of the strips (e.g., perpendicular to the top surface), as shown, or they may be applied to the edges of the strips 98 on the top surfaces, or both. Similar to the embodiment of FIG. 11, some or all of the gaps may have layers 94 on either side, such as those on the top half of the end windings.

Accordingly, (super) hydrophobic and/or oleophobic coating materials and/or (super) hydrophilic or oleophilic coating materials may be utilized in electric machines thermal management. The use of these coating materials may allow for a uniform flow distribution without additional coolant loop(s) and pumping power, which may require additional costs and may result in efficiency losses. In addition, the coating materials may improve the reliability of electric machines by eliminating localized hot spots and decreasing power loss due to the reduction of end-winding temperatures. Moreover, a reduction in electric machine size may be realized due to the super hydrophobic/oleophobic coated surfaces.

Figure 13:
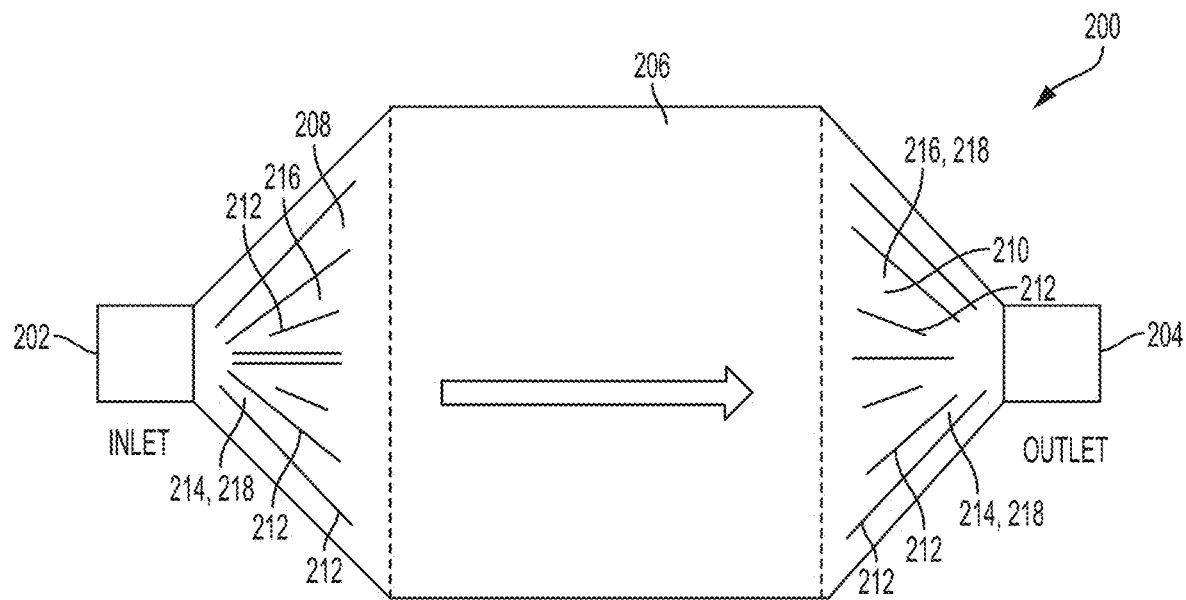
FIG. 13 is a schematic partial section view of a cold plate (e.g., for a power inverter) including a plurality of lines of repellant coating to facilitate coolant distribution at the inlet and the outlet, according to an embodiment.

As described above, the repellant coating may also be applied to a power inverter cooling system, such as in a cooling plate. With reference to FIGS. 13-15, embodiments are shown of a cold plate 200 including a repellant coating for controlling or affecting coolant flow therein. FIG. 13 shows a schematic example of a cold plate 200 having an inlet 202 and an outlet 204. Between the inlet 202 and the outlet 204 may be the cooling or heat-transfer region or area 206. Between the inlet 202 and the cooling region 206 there may be a flow spreading region or area 208 and between the cooling region 206 and the outlet 204 there may be a flow collecting region or area 210. In one embodiment, the inlet 202 and/or the outlet 204 may be narrower (e.g., smaller width) that the cooling region 206. Therefore, the flow spreading region 208 may increase in width from the inlet 202 to the cooling region 206 and/or the flow collection region 210 may decrease in width from the cooling region 206 to the outlet 204. The increase or decrease may be continuous, however it is not required. For example, the increase/decrease may be at a constant rate (e.g., a straight line, as shown), or it may be non-constant (e.g., a curve or exponential).

Since the inlet 202 and/or the outlet 204 may be narrower than the cooling region 206, there may be non-uniform flow of coolant out of the inlet and/or into the outlet. To increase the uniformity of the coolant flow distribution, physical barriers may be included in the flow spreading or flow collection regions, such as channel walls or flow steps. However, this may result in increased pressure drops within the cold plate 200, which may require increased pumping power of the coolant. This increased pressure drop and pumping power may reduce the efficiency of the cooling system.

With reference to FIG. 13, it has been discovered that lines 212 of the repellant coating described above may be used to improve the uniformity of the coolant flow in the flow spreading and/or the flow collection regions. As shown, one or more lines 212 of the repellant coating may be applied in the flow spreading region 208 and/or the flow collecting region 210. In the flow spreading region 208, the line(s) may at least partially redirect the flow from the inlet 202 such that it is spread out when it reaches the cooling region 206. For example, there may be a plurality of lines 212, at least some of which fan out from the inlet 202 towards the cooling region 206. A portion of the lines 212 may extend from an area adjacent to the inlet 202 to an area adjacent to the cooling region 206. Some of the lines 212 may extend outward in a direction from the inlet 202 to the cooling region 206, similar to the expanding width of the flow spreading region 208. The lines 212 may form one or more (e.g., a plurality) of flow channels 214 extending between the inlet 202 and the cooling region 206. In addition to lines 212 that extend from the inlet 202 to the cooling region 206, there may be additional, shorter lines 212 that sub-divide a flow channel 214 into secondary or smaller flow channels 216.

In the flow collecting region 210, the line(s) may at least partially redirect the flow from the cooling region 206 such that it is condensed or funneled towards the outlet 204. For example, there may be a plurality of lines 212, at least some of which fan out from the outlet 204 towards the cooling region 206. Alternatively, the lines 212 may be described as funneling towards the outlet 204. A portion of the lines 212 may extend from an area adjacent to the outlet 204 to an area adjacent to the cooling region 206. Some of the lines 212 may extend inward in a direction from the cooling region 206 towards the outlet 204, similar to the narrowing or contracting width of the flow collecting region 210. The lines 212 may form one or more (e.g., a plurality) of flow channels 214 extending between the outlet 204 and the cooling region 206. In addition to lines 212 that extend from the outlet 204 to the cooling region 206, there may be additional, shorter lines 212 that sub-divide a flow channel 214 into secondary or smaller flow channels 216. Similar to above with respect to FIGS. 3-4, a wetting coating 218 (e.g., similar to wetting coating 54) may also be applied within the flow channels 214 and/or 216 to further encourage coolant to flow therethrough. For example, the wetting coating 218 may be applied to a portion or all of the flow channels 214/216, such as in the form of lines or as a continuous layer. The wetting coating(s) 218 may therefore further facilitate the spreading/collection of the coolant within the flow channels.

Figure 14A:
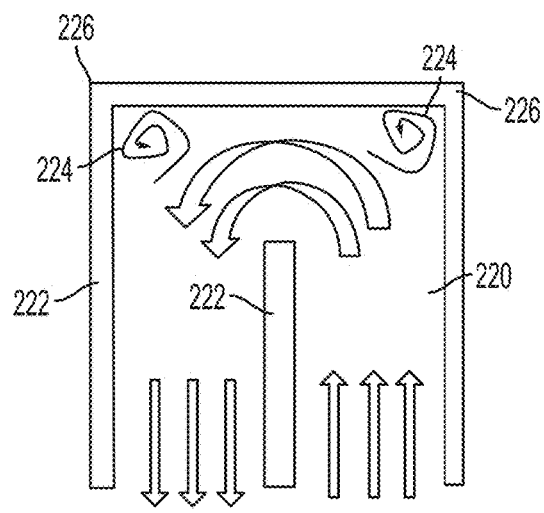
FIG. 14A is a schematic top view of a turn in a channel of a cold plate without a repellant coating showing the formation of recirculation zones, according to an embodiment.
Figure 14B:
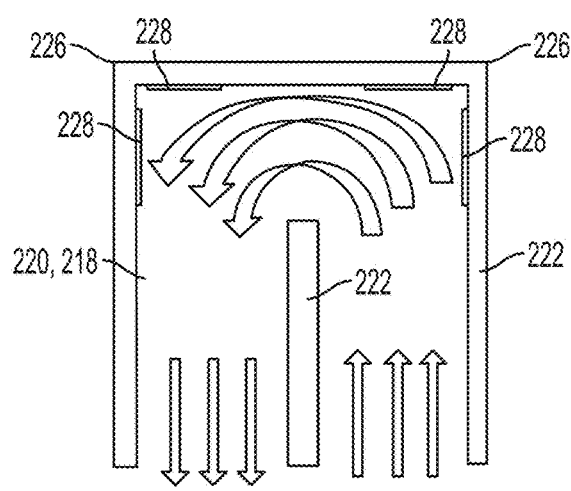
FIG. 14B is a schematic top view of a turn in a channel of a cold plate with a repellant coating in the corners showing the elimination of recirculation zones, according to an embodiment.
Figure 15:
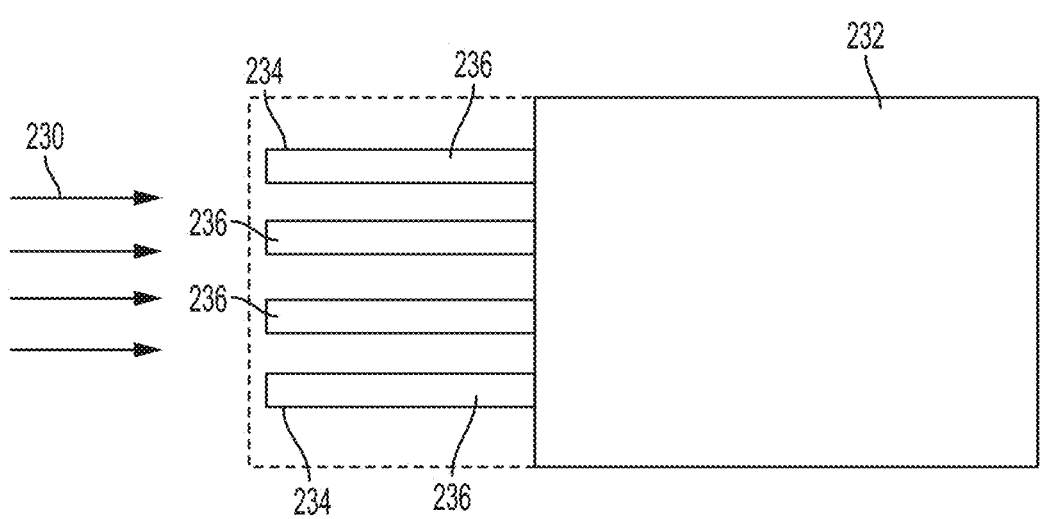
FIG. 15 is a schematic partial section view of a cold plate having a repellant coating on a top surface of the channel walls to prevent coolant from flowing between the channels and the cold plate cover, according to an embodiment.

With reference to FIGS. 14A and 14B, the repellant coating may also be applied to internal coolant channels 220 within the cold plate 200 to improve flow therein. The cooling region 206 shown in FIG. 13 may include one or more coolant channels 220 through which the coolant flows to exchange heat. The coolant channels 220 may generally form a winding, tortuous, and/or serpentine shape that increases the contact time of the coolant with the cold plate (relative to a straight path from the inlet to the outlet). Any suitable channel shape or path may be used with the disclosed cold plate 200. In general, the channels 220 will include at least one turn therein having a relatively large angle. In the examples shown in FIGS. 14A and 14B, the channel walls 222 form a turn having a 180 degree angle (e.g., complete reversal of direction). However, other turn angles are possible and the illustrated turns are merely an example.

As shown in FIG. 14A, it has been found that large turns in the coolant channels 220 may result in regions or zones where the coolant stagnates and/or recirculates (e.g., forms eddies). These zones, referred to herein as recirculation zones 224, may result due to low or no-slip conditions at the channels walls 222. These conditions may be causes by the relatively high angle turns in the channels 220. The recirculation zones 224 may occur in the corner(s) 226 of a high angle turn, as shown in FIG. 14A. Accordingly, a portion of the coolant may become stuck in the recirculation zones 224 during operation of the cold plate 200 and may reduce the effectiveness and/or efficiency of the cold plate 200.

With reference to FIG. 14B, it has been discovered that placing one or more layers 228 of the repellant coating in the corners 226 of the channels 220 may change the walls 222 from no/low-slip to a slip condition, thereby reducing or eliminating the recirculation zones 224. In one embodiment, where two walls 222 meet to form a corner 226, a layer 228 of the repellant coating may be applied to one or both walls 222 at or near the meeting point of the walls 222. The term corner does not necessarily mean a 90 degree intersection, but may refer to two walls meeting at an angle (e.g., 45-135 degrees, 60-120 degrees, or 75-105 degrees). In the embodiment shown in FIG. 14B, there are two 90 degree corners formed in the outer walls 222 of the channel 220. A layer 228 of repellant coating is applied on the walls 222 on either side of the corner 226. As shown, the layers 228 of the repellant coating may prevent the formation of recirculation zones 224 and may cause most or all of the coolant to continue flowing around the turn instead of stagnating. In areas where there is relatively little turn in the channels 220, there may be no coating applied. Accordingly, by applying a liquid repellant coating in areas with sharp turns, coolants in a cold plate cooling region may flow more evenly and cooling may be performed more effectively and/or efficiently. Similar to above with respect to FIGS. 3-4, a wetting coating 218 may also be applied within the channels 220 to further encourage coolant to flow therethrough. For example, the wetting coating 218 may be applied to a portion or all of the channel 220, such as in the form of lines or as a continuous layer. In one embodiment, the wetting coating 218 may be applied in an arcuate direction in the area indicated by the flow arrows. The wetting coating(s) 218 may therefore further facilitate the flow of coolant through the channels 220 so that it does not get stuck in recirculation zones 224.

With reference to FIG. 15, an example of a partial cut-away top view is shown of a cooling region of a cold plate. As described with reference to FIGS. 14A and 14B, the cooling region may include channels 220 formed by walls 222. The arrows 230 indicate the direction of coolant flow through the channels 220. To enclose the channels 220, the cold plate may include a cover 232 that is configured to contact the top surfaces 234 of the walls 222, thereby sealing off one channel 220 from another. However, it has been found that in practice, small gaps may occur between the top surfaces 234 of the walls 222 and the cover 232. The cover 232 may be a rigid or semi-rigid plate or sheet. During manufacturing, small variations in the tolerances of the walls 222 and/or the cover 232 may cause the cover 232 to not completely cut off the flow of coolant between the cover 232 and the top surfaces 234 of the walls 222. If such gaps exist, it may reduce the efficiency and/or effectiveness of the cold plate cooling. For example, gaps may allow relatively cold coolant at or near the inlet to mix with relatively warm coolant at or near the exit. Gaps may also allow coolant to take a more direct path from the inlet to the outlet without completely flowing through the channels 220, which, as described above, may be configured to be winding, tortuous, etc. to increase the contact time of the coolant.

In at least one embodiment, it has been discovered that a repellant coating (e.g., hydrophobic or oleophobic, described above) may be use as a gap filler and/or barrier to prevent cross-flow of coolant. Layers 236 of the repellant coating may be applied to the top surfaces 234 of the walls 222. Accordingly, even if gaps exist between the top surfaces 234 and the cover 232, the coolant may be repelled from passing through the gap into another channel 220. In addition to, or instead of, applying the coating to the top surfaces 234, the layers 236 may be applied to an underside of the cover 232 in areas corresponding to the location of the top surfaces 234 when the cold plate is assembled.

Accordingly, (super) hydrophobic and/or oleophobic coating materials and/or (super) hydrophilic and/or oleophilic coating materials may be utilized for the inverter thermal management. The use of these coating materials may allow for a uniform flow distribution without adding physical channel walls or steps and pumping power. These additions may add costs, increase pressure drop, and add efficiency losses. In addition, the coatings may improve the reliability of the inverter system by eliminating localized hot spots and/or decreasing power losses due to the reduction of component temperature increases caused by the localized hot spots.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A power inverter cold plate, comprising:
a coolant inlet;
a coolant outlet;
a coolant heat-transfer region disposed between the coolant inlet and outlet;
a coolant flow spreading region between the coolant inlet and the heat-transfer region;
a coolant flow collection region between the coolant outlet and the heat-transfer region; and
one or more layers of a hydrophobic or oleophobic coating disposed in the coolant flow spreading region, the coolant flow collection region, or both, and configured to control a flow of coolant to and from the coolant heat-transfer region, respectively;
wherein the one or more layers include a plurality of strips in the coolant flow spreading region and/or the coolant flow collection reagion;
wherein the plurality of strips define a plurality of coolant flow paths therebetween; and
one or more layers of a hydrophilic or oleophilic coating within the plurality of flow paths.

2. The cold plate of claim 1, wherein the plurality of coolant flow paths fan out from the inlet towards the coolant heat-transfer region.

3. The cold plate of claim 1, wherein the plurality of coolant flow paths funnel from the coolant heat-transfer region towards the coolant outlet.

4. The cold plate of claim 1, wherein the coolant heat-transfer region includes at least one coolant flow channel having one or more turns, each turn including at least one corner; and
at least one of the one or more layers of the hydrophobic or oleophobic coating is located at or near the at least one corner.

5. The cold plate of claim 4, wherein a layer of the hydrophobic or oleophobic coating is located on each side of the at least one corner.

6. The cold plate of claim 4, wherein the one or more turns includes a 180 degree turn having two 90 degree corners and a layer of the hydrophobic or oleophobic coating is located on each side of both 90 degree corners.

7. The cold plate of claim 1, wherein the coolant heat-transfer region includes at least one coolant flow channel having at least one wall and the cold plate further comprises a cover configured to contact a top surface of the at least one wall to retain coolant in the at least one coolant flow channel; and
at least one of the one or more layers of the hydrophobic or oleophobic coating overlies the top surface of the at least one wall and is configured to prevent coolant from passing between the cover and the top surface.

8. The cold plate of claim 1, wherein the hydrophobic or oleophobic coating is a super hydrophobic or oleophobic coating having a contact angle of at least 150 degrees with water or oil, respectively.

9. A method, comprising:
applying one or more layers of a hydrophobic or oleophobic coating to a power inverter cold plate to control a flow of coolant in the cold plate, the one or more layers being applied as a plurality of strips to one or more of a coolant flow spreading region, a coolant flow collection region, or both to direct coolant flow to and from a coolant heat-transfer region disposed therebetween;
defining a plurality of coolant flow paths between the plurality of strips;
applying one or more layers of a hydrophilic or oleophilic coating within the plurality of coolant flow paths.

10. The method of claim 9, wherein the one or more layers are applied to a coolant flow channel in the coolant heat-transfer region having one or more turns, each turn including at least one corner; the one or more layers being applied at or near the at least one corner.

11. The method of claim 10, wherein the one or more turns includes a 180 degree turn having two 90 degree corners and a layer of the hydrophobic or oleophobic coating is applied on each side of both 90 degree corners.

12. The method of claim 9, wherein the coolant heat-transfer region includes at least one coolant flow channel having at least one wall and the cold plate further comprises a cover configured to contact a top surface of the at least one wall to retain coolant in the at least one coolant flow channel; and
at least one of the one or more layers of the hydrophobic or oleophobic coating is applied to the top surface of the at least one wall and/or to regions of the cover configured to contact the top surface to prevent coolant from passing between the cover and the top surface.

\* \* \* \* \*